United States Patent [19]

Hongo et al.

[11] 4,444,801

[45] Apr. 24, 1984

[54] METHOD AND APPARATUS FOR CORRECTING TRANSPARENT DEFECTS ON A PHOTOMASK

[75] Inventors: Mikio Hongo; Masao Mitani; Tateoki Miyauchi, all of Yokohama; Masaaki Okunaka, Fujisawa; Katsuro Mizukoshi, Yokohama, all of Japan

[73] Assignee: Hitachi, Ltd., Tokyo, Japan

[21] Appl. No.: 338,864

[22] Filed: Jan. 12, 1982

[30] Foreign Application Priority Data

Jan. 14, 1981 [JP] Japan ................................. 56-3044
Jan. 14, 1981 [JP] Japan ................................. 56-3045

[51] Int. Cl.³ ..................... B23K 9/00; B05D 3/06; G01D 15/10; G01D 9/42
[52] U.S. Cl. ................ 427/10; 219/121 LM; 346/76 L; 346/108; 427/53.1; 427/54.1; 427/142
[58] Field of Search ............... 427/10, 53.1, 54.1, 427/142; 219/121 LM; 346/76 L, 108

[56] References Cited

U.S. PATENT DOCUMENTS

| 4,190,759 | 2/1980 | Hongo et al. ............... 219/121 LM |
| 4,200,668 | 4/1980 | Segal et al. ..................... 427/10 X |
| 4,256,778 | 5/1981 | Mizukami et al. .................... 427/10 |

FOREIGN PATENT DOCUMENTS 561532 1/1981 Japan .

*Primary Examiner*—Michael R. Lusignan
*Attorney, Agent, or Firm*—Antonelli, Terry & Wands

[57] ABSTRACT

A method and apparatus for correcting transparent defects on a photomask are disclosed. A metal-organic complex solution is applied to a transparent defect portion and its periphery on the photomask. The transparent defect portion is then exposed to a visible ray or ultraviolet ray to deposit a metal, a metal oxide or a composition thereof, while the light transmission quantity through the transparent defect portion is measured. After the measurement falls below a predetermined level relative to the quantity of the transmitted light at the start of exposure, the exposure is terminated to thereby complete the correction of the transparent defects.

40 Claims, 8 Drawing Figures

METHOD AND APPARATUS FOR CORRECTING TRANSPARENT DEFECTS ON A PHOTOMASK

BACKGROUND OF THE INVENTION

The present invention relates to a method and apparatus for correcting transparent defects on a photomask.

There has been used a lift-off method for correcting transparent defects on the photomask. The lift-off method includes the following steps, and it is disadvantageous that the method needs so many steps and takes long time.

(1) A step of applying photoresist to the entire surface of a photomask which includes the transparent defects.

(2) A step of exposing only the transparent defect portion to light using a partial exposure method.

(3) A step of opening a window in the resist at the transparent defect portion by a process of development.

(4) A step of forming a metallic film over the transparent defect portion and its periphery or over the entire surface of the photomask.

(5) A step of removing the resist and, at the same time, removing the metallic film formed on the resist.

There has also been proposed a method of partial deposition using laser, however, it has many practical problems concerning the accuracy, strength of the film and uniformity of the film.

SUMMARY OF THE INVENTION

It is an object of the present invention to overcome the foregoing prior art deficiencies and provide a method and apparatus for correcting transparent defects on the photomask which works in less steps, less time and also accurately.

In order to achieve the above-mentioned object, the present invention provides a method wherein a metal-organic complex solution is applied to the entire surface of the photomask having a transparent defect portion or only to the transparent defect portion and its periphery, and after that, the transparent defect portion is exposed to visible rays or ultraviolet rays so as to deposit the metal, metal oxide or a composition thereof, thereby correcting the transparent defect on the photomask. The invention is characterized in that the quantity of light transmitted through the photomask is measured by the exposed light which varies during the deposition process, and the exposure is halted or terminated when the quantity of transmitted light falls below a certain level relative to the quantity of light when the exposure was started.

The present invention is further characterized in that the exposure of laser continues for a certain period after the deposition has completed, so that a deposited film with a large bonding strength, high positional accuracy and satisfactory light sealing characteristic can be obtained. Thus, a photomask which stands the practical use can be obtained.

The apparatus of the present invention comprises a means for generating a laser beam, a rectangular slit for forming the cross section of the generated laser beam to have a rectangular shape in arbitrary dimensions, an object lens for condensing the rectangular laser beam so that it is projected as a contracted image of the rectangular slit, an X/Y slide table for carrying a photomask having a transparent defect, a detector for detecting the quantity of light transmitted through the transparent defect portion of the photomask, and a control unit for controlling the position of the X/Y table in accordance with information about the location of the defect portion so that the projection image of the rectangular slit is positioned on the transparent defect portion, for determining the completion of correction of the transparent defect based on a detected signal from the detector, and also for controlling the laser beam ON and OFF. This arrangement surely practices the method of correcting transparent defects mentioned previously.

The present invention is further characterized in that a metal-organic complex is applied to the entire surface of a photomask having a transparent defect portion or to the transparent defect portion and its periphery, and after that visible rays or ultraviolet rays are directed selectively to the transparent defect portion so as to deposit the metal, a metal oxide or a composition thereof, thereby correcting the transparent defect on the photomask. The observation light from the photomask and metal-organic complex which varies during the process of deposition or the reflection image of the reference light is identified, and the exposure by the rays is halted when the difference of contrast in the reflection image falls below a certain value, immediately after the event has occurred, or a certain time after the event has occurred.

The apparatus of the present invention is further characterized in that it comprises a laser oscillator, a rectangular slit for forming the cross section of the laser beam into a rectangle of arbitrary dimensions, an illumination unit for projecting a reference light beam for matching the size of the slit and also registering the position of the slit, a means for guiding the laser beam and the reference light beam together to the rectangular slit, an illumination unit for projecting an observation light beam for observing the pattern of the photomask, a means for joining the laser beam or reference light beam coming through the rectangular slit, an object lens for projecting the image of the slit caused by the laser beam or reference light beam and the observation light beam onto the photomask, an X/Y table movable in the X and Y directions with a photomask placed thereon, a display means for sensing and displaying the reflection image of the photomask caused by the observation light or reference light, and a control unit for controlling the X/Y table, the rectangular slit and the laser oscillator, and also for identifying the difference of the contrast in the reflection image.

The apparatus of the present invention is further characterized in that it comprises a laser oscillator, a rectangular slit for forming the cross section of the laser beam into a rectangle of arbitrary dimensions, an illumination unit for projecting a reference light beam for matching the size of the slit and also registering the position of the slit, a means for guiding the laser beam and reference light beam together to the rectangular slit, an illumination unit for projecting an observation light beam for observing the pattern of the photomask, a means for joining the laser beam or reference light beam coming through the rectangular slit to the observation light beam, an object lens for projecting the image of the slit caused by the laser beam or reference light beam and the observation light beam onto the photomask, an X/Y table movable in the X and Y directions with a photomask placed thereon, a display means for sensing and displaying the reflection image of the photomask caused by the observation light beam or reference light beam, and a control unit for controlling the X/Y table, the rectangular slit and the laser oscillator, and also for identifying the difference of contrast on the reflection image.

The present invention resides in a method of correcting a transparent defect on the photomask, wherein the above-mentioned metal-organic complex is made of an organic solvent added at least by silver nitrate and a carboxylic acid, or silver nitrate, a carboxylic acid and a titanium alcoholate.

The present invention is further characterized in that after depositing a metal, a metal oxide or a composition thereof in the transparent defect portion, a protection film made of a transparent oxidized metal such as a silicon oxide, an indium oxide, a tin oxide, or a titanium oxide is formed over the deposited film, so that the transparent defect portion is not melted when the photomask is washed by a sulfuric acid including oxygen.

DESCRIPTION OF THE PREFERRED EMBODIMENT

Figure 1:
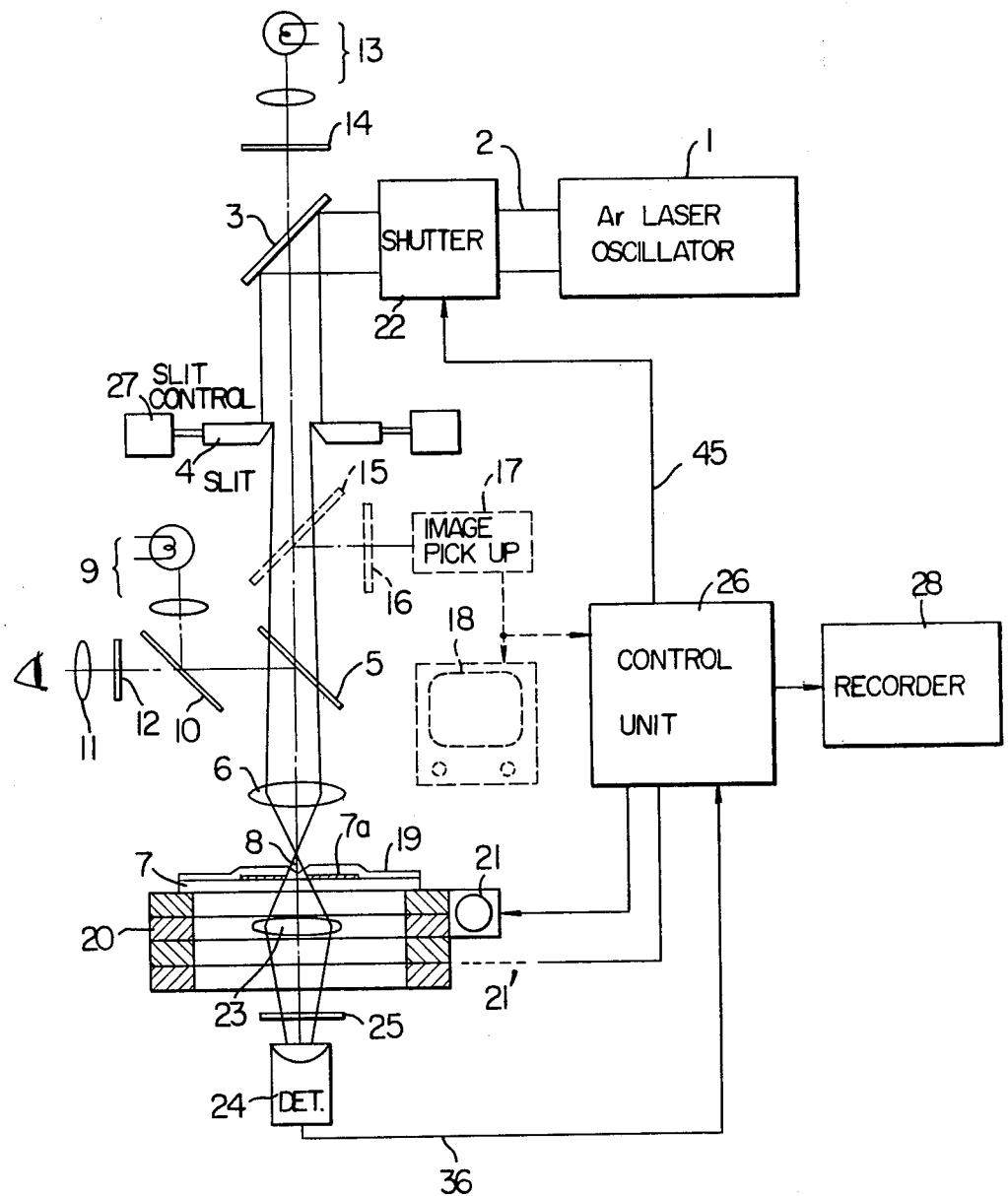
FIG. 1 is a systematic diagram showing one embodiment of a transparent defect correcting apparatus for carrying out a method of the present invention.

FIG. 1 shows an embodiment of the apparatus for correcting a transparent defect on the photomask which practices the method of the present invention. In the figure, reference numeral 1 denotes an Ar laser oscillator which outputs a laser beam having a wavelength 5145 Å. Numeral 22 denotes a shutter for a laser beam 2, 3 a dichroic mirror for directing the laser beam 2 toward the location of a photomask 7, and 4 a rectangular slit located on the path of the laser beam directed to the location of the photomask 7, with its width being able to adjust arbitrarily in the X and Y directions independently. Numeral 27 denotes a drive unit for the rectangular slit, 5 a half mirror, and 6 an object lens. Numeral 9 denotes an illumination light source, 10 a half mirror (semitransparent mirror), 11 an observation optical system, and 12 a laser cut-off filter. These components are used for observation and positioning of the mask pattern on the photomask. Numeral 13 denotes an illumination light source for the slit, and 14 an interference filter. Numeral 15 denotes a half mirror, 16 a laser cut-off filter, 17 an image pickup unit and 18 a minitor TV. These components are used for observing and displaying the projection images of the photomask pattern and the rectangular slit 4. Numeral 20 denotes an X/Y table movable in the X and Y directions with the photomask 7 placed thereon, 21 and 21' drive units for moving the X/Y table 20, 23 a condensing lens, 24 a detector, and 25 an interference filter. These components are used for measuring the quantity of laser light transmitted through a transparent defect 8 on the photomask 7, a metal-organic complex film 19 deposited in the periphery of the defect and a glass substrate. Numeral 26 denotes a control unit for controlling the X/Y table 20 and a shutter 22, and also for checking the deposition state of metal in the metallic complex film 19.

The laser beam 2 generated by the Ar laser oscillator 1 is reflected by the dichroic mirror 3 and directed to the rectangular slit 4 whose width in the X and Y directions can be adjusted independently, so that the cross section of the laser beam is formed to have an arbitrary rectangular shape.

The rectangular laser beam 2 from the rectangular slit 4 is transmitted through the half mirror 5, condensed by the object lens, then projected to the photomask 7 having a transparent defect. Here, the photomask 7 and the rectangular slit 4 are positioned such that the image of the rectangular slit 4 is projected by the object lens 6 in a contracted size which is the reciprocal of the magnifying power of the object lens 6; i.e., assuming the magnifying power of the object lens 6 to be M, the image having a contracted size of 1/M is projected.

Observation and positioning of the photomask pattern are carried out through the observation optical system 11 by joining a light beam from the illumination light source 9 using the half mirrors 5 and 10. The observation optical system 11 is provided with the laser cut-off filter 12 for security of the operator.

The light beam from the slit illumination light source 13 is transmitted through the interference filter 14 so that a specific wavelength is selected, then passes through the dichroic mirror 3. Then the light beam is projected by the object lens 6 onto the photomask 7 as a projection image of the rectangular slit 4. Here, the dichroic mirror 3 has a characteristic that it reflects the wavelength of the laser beam 2, but transmits the specific wavelength of the slit illumination light. Accordingly, the image of the rectangular slit 4 caused by the slit illumination light can also be observed through the observation optical system 11. Furthermore, the photomask pattern and the projection image of the rectangular slit 4 can be observed through monitor TV 18 by means of the half mirror 15, laser cut-off filter 16 and image pickup unit 17.

A metal-organic complex solution is applied to the surface of the photomask 7 having a transparent defect, then it is dried to form a metal-organic complex film 19. The photomask 7 can be moved by means of the X/Y table 20 so that the transparent defect portion 8 registers with the projection image of the rectangular slit 4. The X/Y table 20 can be moved manually and also by the table drive units 21 and 21', and it has a hollow structure so that the laser beam 2 passes through it.

The width of the rectangular slit 4 is adjusted while observation is made through the observation optical system 11 or the monitor TV 18, so that the projection image matches the size of the transparent defect portion 8.

After positioning the mask, the laser beam 2 is projected to the transparent defect portion 8 by opening the shutter 22. The laser beam 2 is projected to exactly the same area as that of the projection image of the rectangular slit 4 caused by the slit illumination light source 13, and transmitted through the metal-organic complex film 19 and the glass substrate at the transparent defect portion 8, then conducted through a condensing lens 23 to a laser detector 24.

In order to avoid the error caused by light coming from the illumination light sources 9 and 13, an interference filter 25 which transmits only the laser beam 2 is provided in front of the detector 24. Generally, the condensing lens 23 is used since the transmitted laser beam spread sharply due to a short focal length of the object lens 6, however, it is not always necessary.

The shutter 22 is used to turn the laser beam 2 ON and OFF. This control can also be achieved by a modulator using the electro-optical or acoustic-optical effect, and it is also possible by controlling the power supply of the Ar laser oscillator 1.

The control unit 26 has the following functions: It reads positional information for a transparent defect on a photomask detected by a defect inspection apparatus and stored on a recording means 28 such as a magnetic recording medium or the like, and activates the table drive units 21 and 21' for the X/Y table 20 so as to pinpoint the temperature defect portion. It receives the electrical signal from the laser detector 24 and checks the deposition state of the metallic film. It turns ON and OFF the laser beam 2 by controlling the shutter 22 or the power supply of the modulator. If the size of the transparent defect portion is known in advance, it is also possible to set up the slit width by activating the drive unit 27 for varying the width of the rectangular slit 4.

Figure 7:
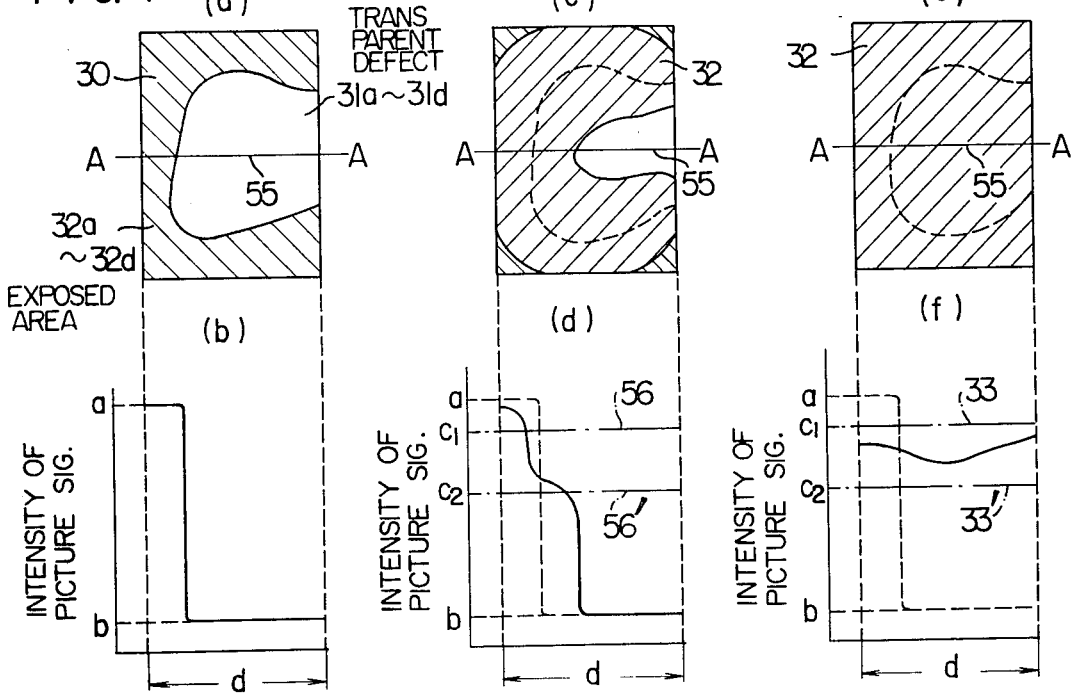
FIGS. 7a to 7f are views showing the conditions of metal-organic complex deposited and the variations in reflection image, respectively.

The following describes, as an example, the method of correcting a transparent defect portion 8 on the photomask 7 by use of the defect correcting apparatus shown in FIG. 7.

On the entire surface or the transparent defect portion 8 and its periphery of the photomask 7 having a transparent defect portion 8, there is applied a metal-organic complex solution, as will be described in detail later, such as an organic solvent (e.g. dimethylsulfoxide) added by silver nitrate and carboxylic acid, then the organic solution is vaporized to form a silver-organic complex film (metal-organic complex film) 19. In this case, a normal pattern 7a is located around the transparent defect portion 8. The photomask 7 with the silver-organic complex film (metal-organic complex film) 19 formed thereon is placed on the X/Y table 20. Then, the table drive units 21 and 21' are activated by the control unit 26 in accordance with positional information supplied from the defect inspection apparatus, so that the transparent defect portion 8 is located at least within the sight of the observation optical system 11 or the image pickup unit 17.

Then, the photomask is positioned precisely and the slit width is adjusted while observing the projection image of the rectangular slit 4 caused by the slit illumination light source 13. In this case, the adjustment is made such that the projection image of the rectangular slit 4 does not jut out of the normal pattern 8a, but covers the transparent defect portion 8 sufficiently.

Then, the shutter 22 is opened to expose the laser beam 2 emitted from the Ar laser oscillator 1 to the transparent defect portion 8. The laser beam 2 is transmitted through the metal-organic complex film 19 and the transparent defect portion 8 of the photomask 7, then through the condensing lens 23 and the interference filter 25, and received by the detector 24 for measuring the intensity of laser.

The detector 24 converts the intensity of laser into an electrical signal and sends the signal to the control unit 26. The control unit 26 memorizes the quantity of transmitted laser when the exposure of the laser beam 2 has started so that it is stored as the reference value. The control unit 26 terminates the exposure using the Ar laser when the intensity of laser falls below a certain level relative to the reference value (e.g. 10% of the reference value). Thus the silver complex (metallic complex) is deposited by the laser beam, and light sealing ability of the mask gains sufficiently.

Figure 4:
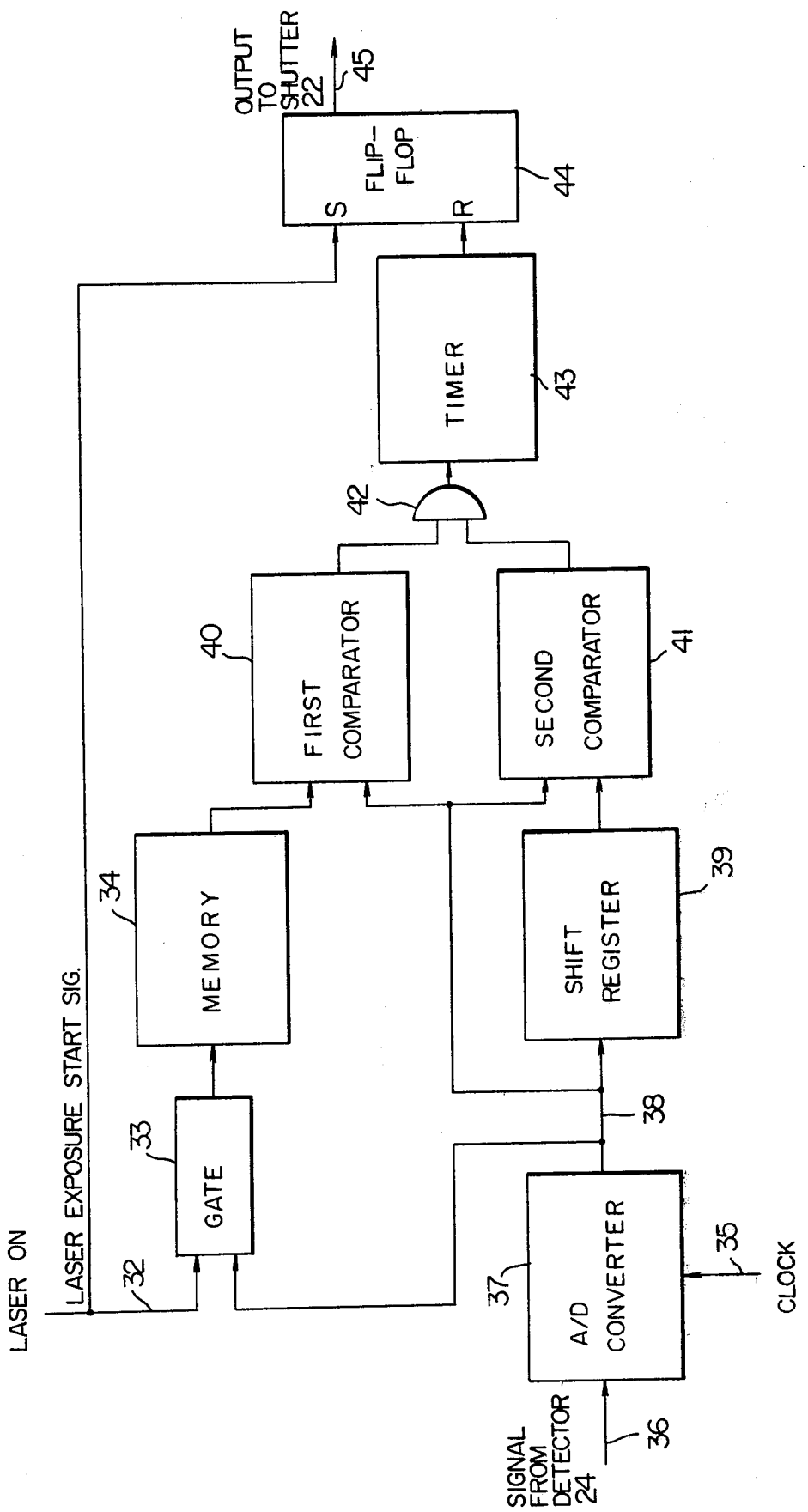
FIG. 4 is a circuit diagram of a control unit used in the apparatus of FIG. 1.

In order to obtain a satisfactory contact between the metallic complex and the glass substrate, the control unit 26 may be constructed as shown in FIG. 4. A gate 33 is momentarily gated in response to a laser exposure start signal 32 so as to store the quantity of laser in a memory 34, and at the same time A/D converter 37 is operated at a certain interval, e.g., in response to a clock signal 35 having a period of 0.1 sec., so that an analog signal 36 from the detector 24 is converted into a digital signal 38 and stored in a shift register 39 to update data. A first comparator 40 compares the signal 38 representing the quantity of transmitted laser derived from the A/D converter 37 and the quantity of transmitted laser at the beginning of the exposure stored in the memory 34, and issues a signal when the current quantity falls below a certain level relative to the initial quantity (e.g. 10% of the initial value). A second comparator 41 compares the signal 38 with the quantity of transmitted laser obtained previously, i.e. preceding by 0.1 sec., and stored in the shift register 39, and issues a signal when the current quantity becomes equal or less than the previous quantity. An AND gate 42 operates a timer 43 for a predetermined duration in response to the signals from the first and second comparators 40 and 41. The flip-flop 44 is set by the laser exposure start signal 32 and reset by the output of the timer 43. The output 45 of the flip-flop 44 is delivered to the shutter 22.

Thus, the control unit 26 starts to count the elapsing time when the quantity of transmitted laser has fell below a certain level relative to the initial quanity (e.g. 10% of the initial value) and at the same time when the current quantity has become equal or less than the previous (preceded by 0.1 sec) quantity. The control unit 26 maintains the exposure by the laser beam 2 for a predetermined duration, then issues a signal to the shutter 22 to terminate the exposure of the laser beam 2.

The transparent defect portion 8 of the photomask 7 is corrected by directing the laser beam 2 to the metal-organic complex film 19, that causes the deposition of a metallic film.

One transparent defect portion 8 has thus been corrected. After further observation of the mask, when a correcting completion signal is issued by the operator, the X/Y table 20 is moved to the next defect portion.

After metallic films have been deposited in all transparent defect portions 8, the photomask 7 is washed to remove the metal-organic complex film 19 except for the portion where the metallic film has been deposited, and the correcting operation is completed.

Figure 2:
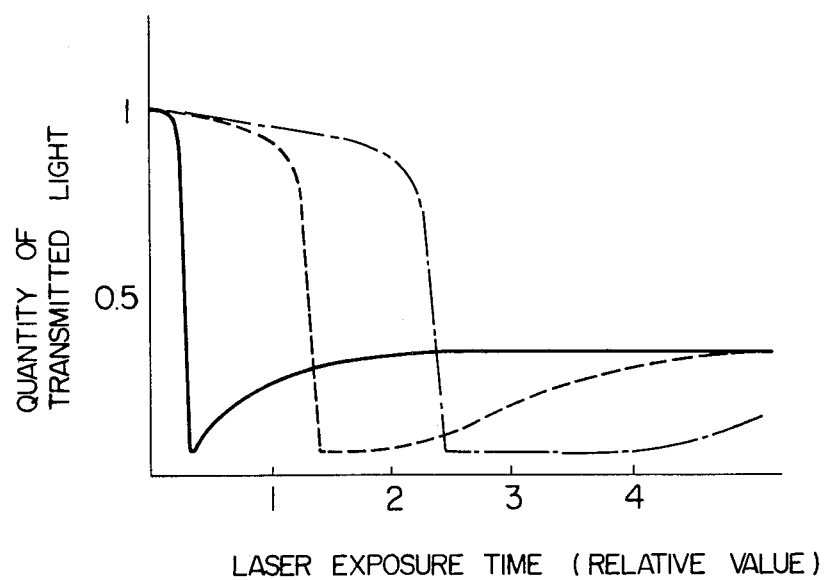
FIG. 2 is a diagram representing the variation of a transmitted light quantity in correcting transparent defects according to the method of the present invention.

FIG. 2 shows an example of how the quantity of transmitted laser varies during the correcting operation according to the method of the present invention. In FIG. 2, the horizontal axis indicates the elapse time after exposure of the laser beam has started, and the vertical axis indicates the quantity of transmitted laser with the quantity immediately after the exposure has started being set to 1.

In FIG. 2, three curves of the solid line, dashed line, and dashed and dotted line result from different power densities of the laser beam at the transparent defect portion, and the power density decreases in the above-mentioned order of the curves. In the case of a large power density as shown by the solid line, the metallic film or metal oxide film is deposited in a very short time, resulting in a sharp reduction of transmitted laser, and if illumination by the laser beam is continued after the minimum value has been marked, the transmitted laser increases gradually, then reaches the saturation state.

In the case of a small power density, as shown by the dashed and dotted line, it takes time before starting the deposition of the metallic film or metal oxide film. But once the deposition begins, the transmitted laser decreases sharply, and if exposure of the laser beam is continued after the minimum level has been marked, the transmitted laser increases following a dull change in the initial period.

In the case of an intermediate power density, a characteristic between former two cases results as shown by the dashed line in FIG. 2.

Figure 3:
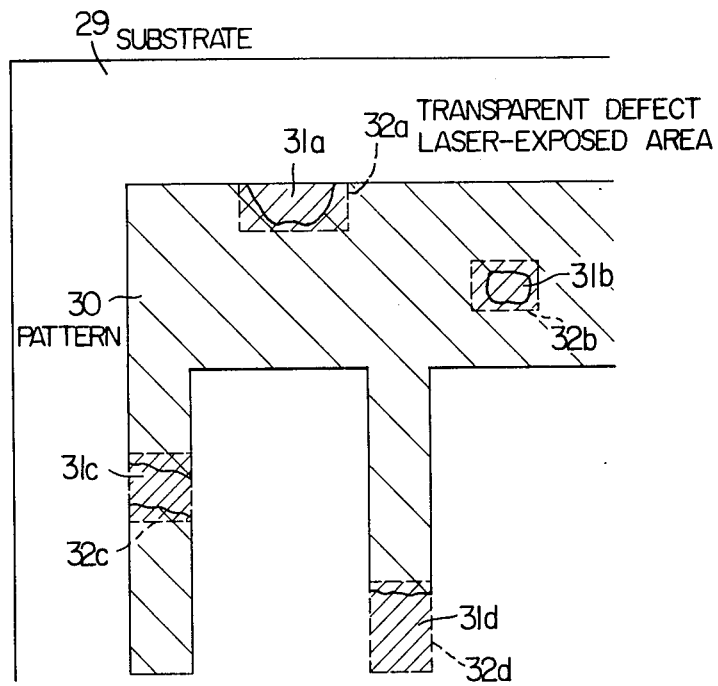
FIG. 3 is a view showing transparent defects and areas to be exposed by laser in a photomask.

FIG. 2 shows data when a rectangular metallic or metal oxide film is deposited on a simple glass substrate with a silver-organic complex film formed thereon. However, in the actual operation for correcting a transparent defect as shown in FIG. 3, time taken to deposit a metallic or metal oxide film after exposure has started differs largely depending on the shape and the size of a transparent defect as shown by 31a, 31b, 31c and 31d which exist in the pattern 30 formed on the photomask substrate 29 and also on the size of the laser exposure area as shown by 32a, 32b, 32c and 32d.

In most cases of the actual operation for correcting a transparent defect portion, the exposure area 32 by the laser beam partly overlays the normal mask pattern 30, causing a faster temperature rise than portions of only complex film due to the absorption of the laser beam in the metallic film of the normal pattern. This results in a rapid progress of deposition, which rapidly spreads over the entire exposure area.

For this reason, in correcting an actual transparent defect portion, time taken to complete the deposition of a metallic or oxide film (time until the minimum level is reached in FIG. 2) will be ½-⅓ to 1/20-1/30 of the time shown in FIG. 2. However, the behaviour after the metallic or metal oxide film has been deposited depends solely on the power density of exposure, and is independent of the size of the transparent defect portion and the degree of overlap of the mask pattern and the exposure area.

Subsequently, after the metallic or metal oxide film has been deposited, i.e., after the minimum level of the transmitted laser has been reached, the laser beam is directed to the metallic or metal oxide film for a certain duration so that the bonding strength of contact between the deposited metallic or metal oxide film and the glass substrate is enhanced. The duration of exposure differs depending on the power density of the exposure. In the case of the exposure condition shown by the dashed line in FIG. 2, the proper duration will be 0.2 (in relative time), and for the condition of the dashed and dotted line, the proper duration will be 1 (in relative time). In the case of the exposure condition shown by the solid line, the power density is too high, and even under the proper power density, the deposited metallic or metal oxide film can be damaged or the light sealing characteristic is deteriorated if the exposure time is too long. The proper power density varies depending on the composition of the complex film and the thickness of the film.

The metal-organic complex as has been described in this embodiment is the metallic complex in a narrow meaning, that is, it is a concept including metallic salts created in the general reaction of solution, in addition to an atom group made up of one or more metallic atoms as the center atom and another atom or atoms, i.e. ligand, linking to the center atom to form an atom group.

According to one embodiment of the present invention, a solution made of an organic solvent added by silver nitrate, a carboxylic acid and an additive is used as a metal-organic complex. In this case, a solute carboxylic acid silver salt is produced in the solution. The reason why a carboxylic acid silver salt among many silver salts is preferably used is that it easily melts in the organic solvent and it forms a satisfactory film even if the organic solvent is vaporized.

There are various kinds of carboxylic acids usable to produce a carboxylic acid silver salt. Those showing satisfactory filming characteristics in practical application process are: dicarboxylic acids having two carboxyl groups (—COOH) such as for example, oxalic acid, malonic acid, succinic acid, glutaric acid, adipic acid, pimelic acid, suberic acid, azelaic acid, sebacic acid, fumaric acid, maleic acid, and citraconic acid. Among those, citraconic acid is particularly satisfactory for making a film.

Besides the dicarboxylic acids, a carboxylic acid having satisfactory filming property in practical process is a hydroxy acid with a carboxyl group (—COOH) and the alcoholic hydroxyl group (—OH). Some examples of such carboxylic acids are: lactic acid, malic acid, citric acid, tartaric acid, tartonic acid, hydroxyacrylic acid, glycolic acid, glyceric acid, $\beta$-hydroxypropionic acid, $\alpha$-hydroxy-n-butyric acid, $\alpha$-hydroxyisobutyric acid.

Some examples of the organic solvent are: the organic solvents of alcohol type, Cellosolve type, carbitol type, glycol type, dimethylsulfoxide, dimethylacetamide and dimethylformamide. Among those, the best solvent is a mixture of methyl Cellosolve and acetonitrile.

In addition, the contact between the deposited metallic film, metal oxide film or a composition thereof and the substrate can be enhanced by addition of a titanium alcoholate. Particularly, titanium tetrabutylate is the best.

A complex film having a thickness of 0.1-1 $\mu$m is formed with the foregoing solution used as an application liquid. The metallic film and the titanium oxide film deposited in the foregoing method have a large bonding strength to the substrate, and they have a transmissivity of 2-10% for the wavelength of 3500 Å to 5000 Å.

In this embodiment, an Ar laser oscillator is used for the laser beam source. The wavelength of 5145 Å or 4880 Å or both of them are used. However, it is not limited to these wavelengths, but ultraviolet rays of the Ar laser, the fundamental wave and its harmonic waves of the YAG laser can be used satisfactorily for this purpose.

After depositing the metallic film, metal oxide film or composition thereof, the photomask is washed by methyl Cellosolve or acetonitrile or a mixture thereof, and the complex film other than the deposited portion can be removed completely.

If it is required to enhance the bonding strength of the contact between the deposited silver film and the substrate, it is fulfilled by addition of titanium alcoholate to the silver complex solution. The silver complex solution for correcting the transparent defects of the photomask can preferably be prepared from the following ingredients:

| | |
|---|---|
| silver-organic nitrate | 1.0 mmole (170 mg) |
| citraconic acid | 0.5–5 mmoles (65–650 mg) |
| titanium alcoholate (tetrabutoxy titanium decamer) | 0.5–5 mmoles (110–1100 mg) |
| total organic solvents | 2.3–48 mmoles (144–3062 mg) |
| (1) acetylaceton | 0.2–5 mmoles (20–500 mg) |
| (2) acetonitrile | 1.0–20 mmoles (41–820 mg) |
| (3) methyl Cellosolve | 1.0–20 mmoles (76–1520 mg) |
| (4) dimethylsulfoxide | 0.1–3 mmoles (7–222 mg) |

When a silver complex solution prepared by the above-mentioned formulation is used as the application liquid, and the bonding strength between the silver-titanium oxide film deposited in the foregoing method and the substrate is enhanced considerably. The transmissivity of the silver-titanium oxide film deposited in this manner ranges from 2 to 10% for visible rays having a wavelength of 3500–5000 Å. Other kinds of titanium alcoholates usable for this purpose are:

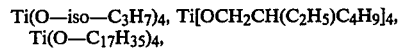
Ti(O—iso—C$_3$H$_7$)$_4$, Ti[OCH$_2$CH(C$_2$H$_5$)C$_4$H$_9$]$_4$, Ti(O—C$_{17}$H$_{35}$)$_4$,

Ti(O—iso—C$_3$H$_7$)$_2$[OC(CH$_3$)CHCOCH$_3$]$_2$,

Ti(O—n—C$_4$H$_9$)$_2$[OC$_2$H$_4$N(C$_2$H$_4$OH)$_2$]$_2$,

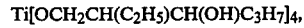
Ti[OCH$_2$CH(C$_2$H$_5$)CH(OH)C$_3$H$_7$]$_4$,

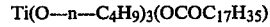
Ti(O—n—C$_4$H$_9$)$_3$(OCOC$_{17}$H$_{35}$)

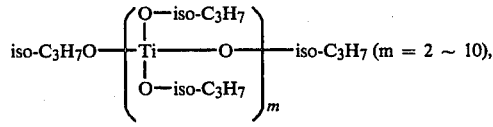
$$\text{iso-C}_3\text{H}_7\text{O}\left(\begin{array}{c}\text{O—iso-C}_3\text{H}_7\\|\\ \text{Ti}\text{———O}\\|\\ \text{O—iso-C}_3\text{H}_7\end{array}\right)_m \text{iso-C}_3\text{H}_7 \quad (m = 2 \sim 10),$$

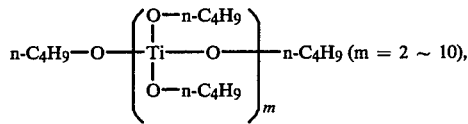
$$\text{n-C}_4\text{H}_9\text{—O}\left(\begin{array}{c}\text{O—n-C}_4\text{H}_9\\|\\ \text{Ti}\text{———O}\\|\\ \text{O—n-C}_4\text{H}_9\end{array}\right)_m \text{n-C}_4\text{H}_9 \quad (m = 2 \sim 10),$$

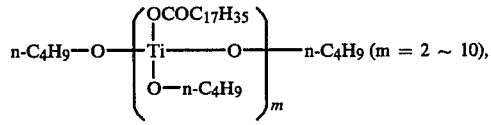
$$\text{n-C}_4\text{H}_9\text{—O}\left(\begin{array}{c}\text{OCOC}_{17}\text{H}_{35}\\|\\ \text{Ti}\text{———O}\\|\\ \text{O—n-C}_4\text{H}_9\end{array}\right)_m \text{n-C}_4\text{H}_9 \quad (m = 2 \sim 10),$$

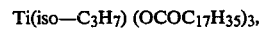
Ti(iso—C$_3$H$_7$) (OCOC$_{17}$H$_{35}$)$_3$,

Ti(iso—C$_3$H$_7$)[OCOC(CH$_3$)=CH$_2$]$_2$(OCOC$_{17}$H$_{35}$),

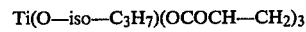
Ti(O—iso—C$_3$H$_7$)(OCOCH—CH$_2$)$_3$

For the metal-organic complex solution used in the present invention other than the above-mentioned silver-organic complex solution, a cobalt-organic complex solution or a copper complex solution can be used. Here, the cobalt-organic complex solution is a solution made of an organic solvent added by cobalt nitrate (Co(NO$_3$)$_2$·nH$_2$O) and carboxylic acid, and the copper-organic complex solution is a solution made of an organic solvent added by copper nitrate (Cu(NO$_3$)$_2$·nH$_2$O) and carboxylic acid. The organic solvent and carboxylic acid are the same as used in the silver complex solution.

In the case of the silver-organic complex solution, silver is deposited. However, in the cases of the cobalt-organic complex solution and the copper-organic complex solution, metals are deposited as a black oxide. The cobalt oxide has a transmissivity of 2–4% and the copper oxide 3–9% for visible rays with a wavelength of 4000–5000 Å, and these values of transmissivity are good enough for practical use. In this case, however, the cobalt and copper chelates need to be added with the surface active agent in order to improve the filming characteristics. A nonionic surface active agent is particularly suited for this purpose. Some examples of the nonionic surface active agent are: polyethylene glycol alkyl ethers R(OCH$_2$CH$_2$)nOH, polyethylene glycol fatty acid esters RCO(OCH$_2$CH$_2$)nOH and fatty acid monoglycerides

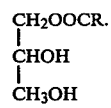
$$\begin{array}{c}\text{CH}_2\text{OOCR}\\|\\\text{CHOH}\\|\\\text{CH}_3\text{OH}\end{array}$$

As described above, after depositing the abovementioned substance by irradiating it with the laser beam, the complex film except for the portion of deposition can be removed by washing the mask with methyl Cellosolve, acetonitrile or the mixture thereof.

Next, the entire surface on the pattern side of the photomask is coated with a transparent body 7. Here, the transparent body 7 is defined as a substance having a high transmissivity for visible rays and ultraviolet rays when it is formed into film, and this substance can be obtained as metal oxide such as silicon oxide (SiO$_2$), tantalum oxide (Ta$_2$O$_5$), niobium oxide (Nb$_2$O$_5$), and tin oxide (SnO$_2$). Among those, silicon oxide has particularly satisfactory resistivity against various chemicals. The reason why the transparent body 7 must have a high transmissivity for visible and ultraviolet rays is that ultraviolet rays or visible rays having a short wavelength is used as the exposure light source for transferring the mask pattern onto the wafer and the like, and it would be difficult to transfer the pattern precisely if the transparent body 7 has a low transmissivity for these rays.

The method of forming the transparent body 7 includes: sputtering method, ion plating method, the method of spraying, soaking or rotary application of a metal-organic complex solution made of an organic solvent added by Ta(OC$_2$H$_5$) or Nb(OC$_2$H$_5$), acetylacetone and the additive onto the entire surface of the pattern, then heating the substrate to form a metal oxide film, and the method of applying a solution made of ethanol added by silicon hydroxide onto the entire surface of the pattern and heating the substrate to form a silicon oxide film.

The transparent body 7 produced in these methods has a high resistivity against scrubbing and washing in chemicals, and thus the deposition film and the pattern can be protected in the washing process.

The arrangement of the present invention has been described, and according to the method of the present invention, a tranparent defect portion can be corrected in less steps of process and in about 1/10 of time consumption as compared with the conventional lift-off method. Moreover, the contact between the substrate and the metallic film, metal oxide film or a composition thereof deposited in the transparent defect portion has a high bonding strength and a mask with a high light sealing characteristic can be reformed precisely. Therefore this method is effective for improving the yield of semiconductor devices.

Furthermore, the apparatus of the present invention is effective for surely practicing the foregoing method of correcting transparent defects.

Another embodiment of the invention will now be described with reference to FIG. 5 to FIG. 8. In the apparatus for correcting a transparent defect shown in FIG. 5, the same reference numerals are used for the identical portions shown in FIG. 1. Reference numeral 50 denotes a dichroic mirror for directing a projection image of the slit caused by the reference light or observation light to a display means. The means for displaying a reflection image of the photomask comprises an interference filter 51, a relay lens 52, a TV camera 53 and a monitor TV 54.

Figure 5:
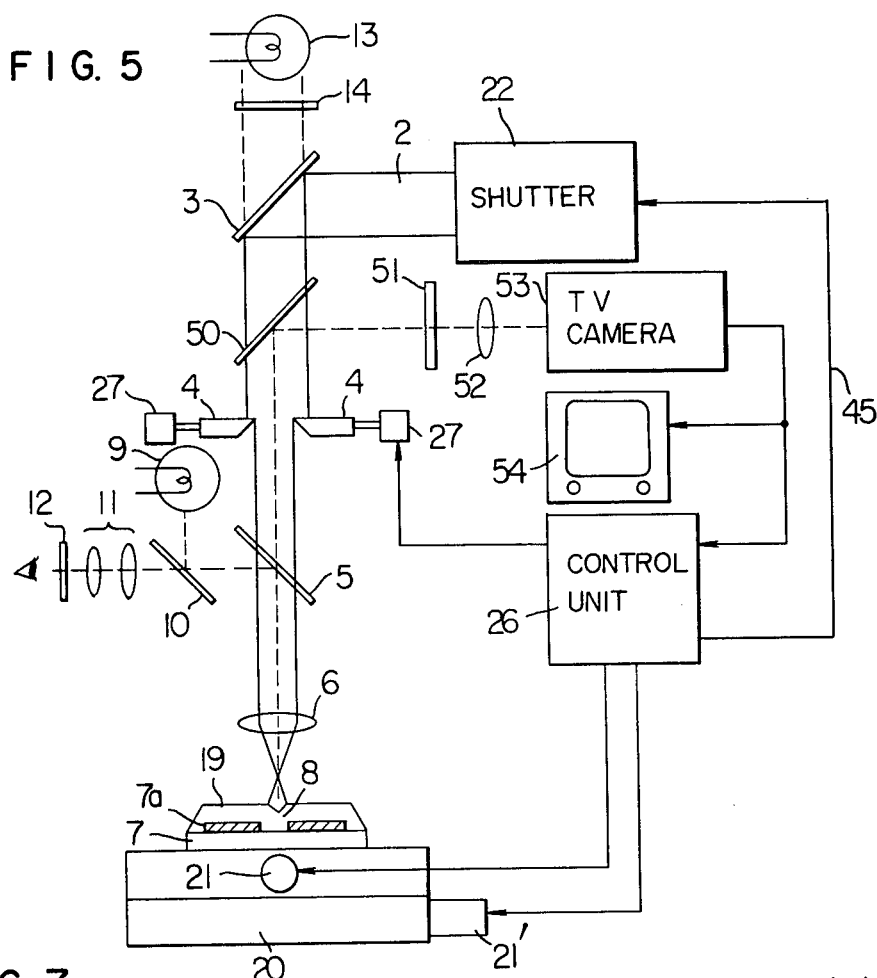
FIG. 5 is a diagram of a transparent defect correcting apparatus according to another embodiment of the present invention.

In the apparatus for correcting a transparent defect, a laser beam having a wavelength of 1.3 μm or less is generated by the laser oscillator 1 (not shown in FIG. 5). The laser beam is then reflected by the dichroic mirror 3 which reflects only a laser wavelength, transmitted through the dichroic mirror 50 which transmits both the laser beam and reference light beam, then formed to have an arbitrary rectangular cross secton through the rectangular slit 4. The width of the slit 4 can be adjusted in the X and Y directions independently by means of the slit drive mechanism 27 in response to the signal from the control unit 26.

The laser beam having an arbitrary rectangular cross section caused by the rectangular slit 4 is transmitted through the half mirror 5, then condensed by the object lens 6 onto the transparent defect portion 8 on the photomask. Thus, a light beam having a wavelength of 1.3 μm or less is projected onto the transparent defect portion 8 on the photomask. The reason why a light beam having a wave length of 1.3 μm or less is used for projecting onto the transparent defect portion 8 of the photomask is as follows. The present invention aims at the fabrication of semiconductor devices, in which the pattern width of the photomask is as small as 1–5 μm for the working mask (mask of 1-fold image) and 10–50 μm for reticle (mask of 10-fold image), and the light beam needs to be condensed smaller than the pattern width in order to remedy the transparent defect portion 8 created in the pattern. However, condensing of a light beam is limited by its wavelength, and thus it is advantageous to use a light beam having a short wavelength in order to correct such fine patterns.

Figure 6:
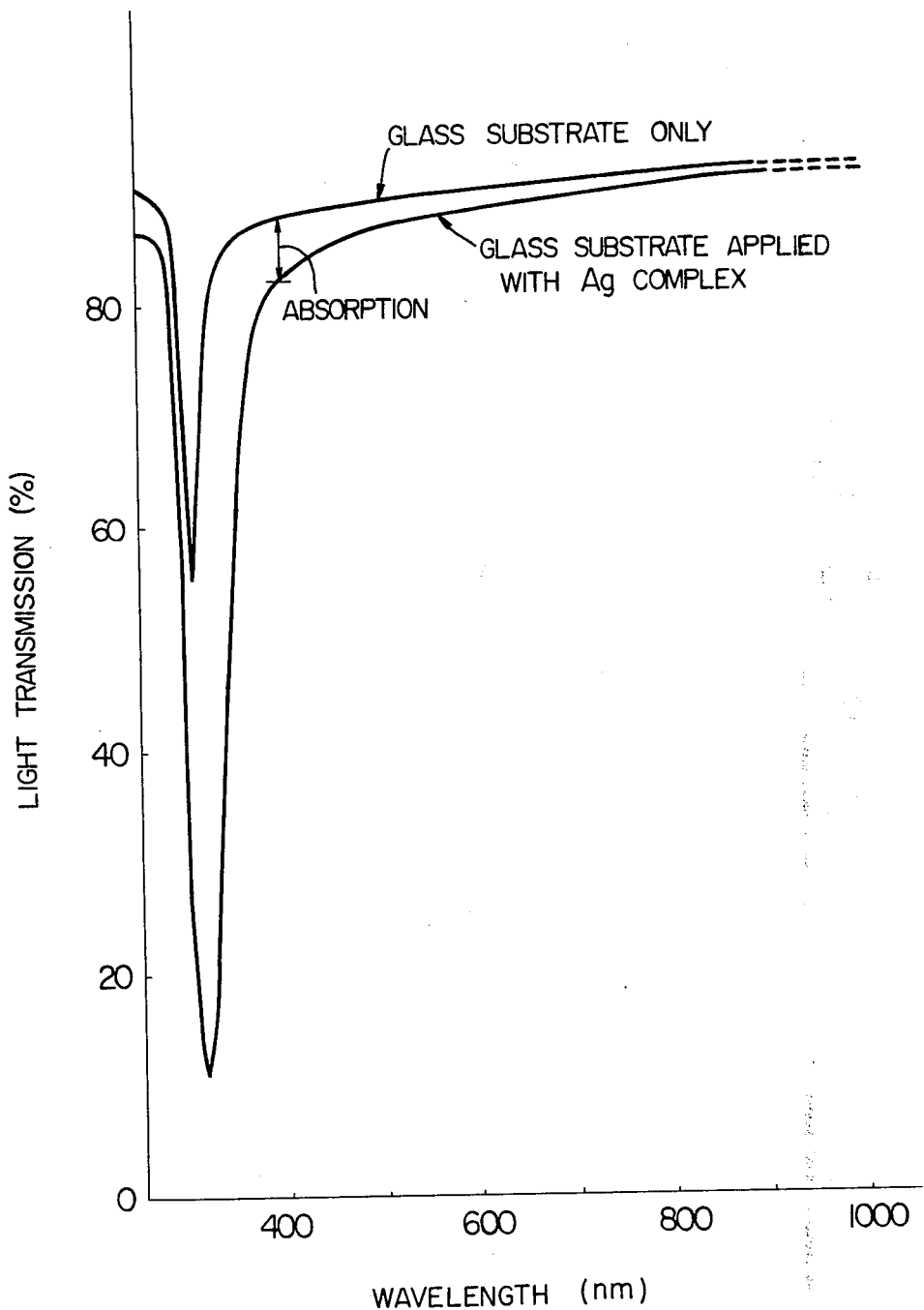
FIG. 6 is a diagram showing characteristics of spectral transmission of the photomask including silver-organic complex used as correcting material.

FIG. 6 shows an example of the spectral transmission curves for correcting material used in this invention (measurement light source: tungsten-filament lamp). The material shown in this figure is the silver-organic complex applied by spinning (1000 RPM, 30 sec.) to a glass substrate, then dried (85° C., 70 min.). Thus, the absorption increases as the wavelength decreases. This means that a light beam having a short wavelength needs less output of the light source. Some materials such as a copper-organic complex have a constant absorption throughout the wavelength.

Observation and positioning of the photomask pattern 7a can be carried out by the observation optical system 11 by joining the observation light beam emitted from the observation light source 9 using the half mirrors 5 and 10.

The interference filter 12 cuts off the wavelength of the laser beam 2 for security of the operator. However, the interference filter is not necessary if the half mirror 5 has a transmissivity of nearly 100% for the wavelength of the laser beam 2.

Observation by the TV camera 53 and the monitor TV 54 is made possible by fully opening the rectangular slit 4.

The reference light source 13 emits a reference light beam in order to identify the range of exposure of the laser beam 2 on the photomask. The light beam from the reference light source 13 is selectively transmitted by the interference filter 14 so as to obtain the reference light beam having a wavelength near to that of the laser beam 2. The reference light beam is transmitted through the dichroic mirrors 3 and 50, and formed to have a rectangular cross section by the rectangular slit 4. Then, the light beam is focused by the object lens 6 on the photomask as a projection image of the rectangular slit 4. This image can be observed through the observation optical system 11.

The interference filter 51 cuts off the laser beam 2 and the reference light beam, and this is not necessary if the dichroic mirror 50 transmits almost 100% of the laser beam 2 and the reference light beam.

The TV camera 53 and the minitor TV 54 are used for observation within the exposure range by the laser beam 2 and also for checking the change of the correcting material 19 due to exposure to the laser beam 2. The TV camera 53 is place at the position where the image of the rectangular slit 4 is focused by the relay lens 52 in a contracted size of 1/N where N is the magnifying power of the relay lens 52. The signal of the image within the exposure range is sent from the TV camera 53 to the monitor TV 54 and the control unit 26.

The control unit 26 has the following functions. It detects the intensity distribution (light intensity distribution of the reflection image) of the picture signal on an arbitrary scanning line from the picture signal of the observation light beam within the exposure range, and displays the intensity distribution. It checks if the correcting material 19 has changed uniformly by exposure using the laser beam 2. It controls the laser oscillator 1 and the X/Y table 20.

Next, the method of correcting a transparent defect on the photomask by use of the foregoing apparatus will be described with reference to FIG. 3 and FIGS. 7a–7f.

FIG. 3 shows the photomask having transparent defect portions 31a–31d to which the correcting material 19 is partially applied (and dried when necessary). The photomask is placed on the X/Y table 20 of the apparatus as shown in FIG. 5, then positioning of the portion to be remedied is carried out using the observation optical system 11 or the monitor TV 54.

Next, the laser irradiation ranges 32a–32d are set up by use of the reference light beam and by moving the rectangular slit 4 in accordance with the size of the transparent defect portions 31a–31d, as shown in FIG. 3.

The monitor TV 54 displays an image of the observation light beam transmitted through the rectangular slit 4.

Next, the monitor TV 54 displays on its screen a detection setting line 55 for setting the position of measuring the intensity distribution of the picture signal on one scanning line, as shown by a line A-A in FIG. 7a, then it is set up in the desired position.

At this time, a display unit in the control unit 26, e.g. an oscilloscope (not shown), displays the intensity distribution of the picture signal as shown in FIG. 7b.

Next, the upper and lower limits C1 and C2 for checking if the correcting material 19 has changed uniformly by exposure to the laser beam are set up by displaying the setting lines 56 and 56' on the display unit in the control unit 26, as shown in FIG. 7d. These setting values C1 and C2 vary depending on the kind of correcting material 19, and thus their proper range must have been obtained in advance.

After these settings have been completed, the laser beam 2 is directed to the entire area of the laser irradiation ranges 32a–32d by issuing the signal from the control unit 26 to activate the laser oscillator 1 or by opening the shutter (not shown) on the laser path, so that the correcting material 19 changes. FIG. 7c shows the changing processes.

At this time, the correcting material 3 does not change in its entire irradiation ranges 32a–32d. Accordingly, the display unit in the control unit 26 displays an intensity distribution of the picture signal as shown in FIG. 7d.

As the exposure using the laser beam 8 continues, the entire area of the irradiation ranges 32a–32d of the correcting material 19 shows a change as shown in FIG. 7e, and the display unit in the control unit 26 displays an intensity distribution as shown in FIG. 7f. At this time, the control unit 26 determines that the correcting material 19 has changed uniformly in the irradiation ranges 32a–32d by exposure to the laser beam 2, and immediately or after a predetermined period the control unit 26 issues a signal for halting the exposure by the laser beam 2 to the laser oscillator 1 or to the shutter drive mechanism (not shown).

After one transparent defect portion 8 has been corrected through the above-mentioned steps of processing, the average intensity of the picture signal in each area is measured, and when the difference between the maximum and minimum values falls below a certain value, it is determined that the material has changed uniformly.

According to another method, positions for measuring the intensity of the picture signal, i.e., measurement points, have been set in advance, and when the difference of the intensity at these points falls below a certain value, it is determined that a uniform change has attained, or the mean value and the spread of the intensity of the picture signal at measurement points are computed, and when these values fall to a predetermined range, it is determined that the correcting material 19 has changed uniformly.

There is still another method, in which the intensity distribution of the picture signal in the entire area of the exposure ranges 32a–32d is measured, and when it falls to the preset range, it is determined that a uniform change has been attained.

Figure 8:
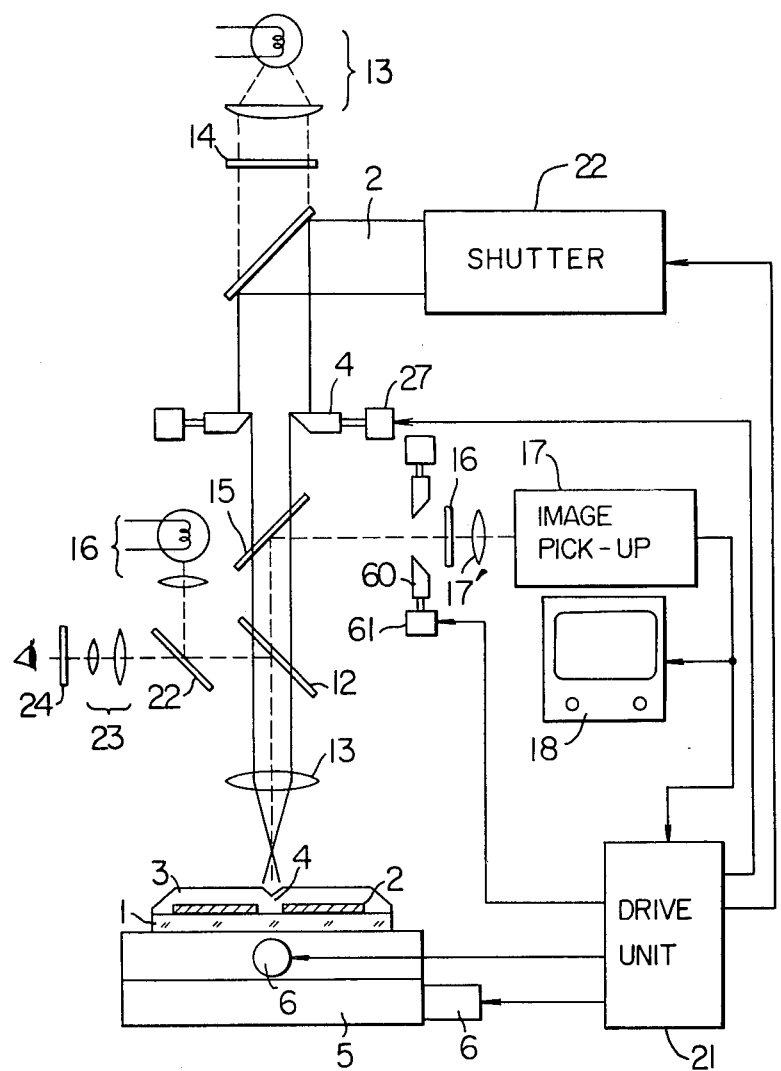
FIG. 8 is a schematic diagram of a transparent defect correcting apparatus according to another embodiment of the present invention.

FIG. 8 shows another embodiment of the apparatus for correcting a transparent defect. This apparatus is basically the same as shown in FIG. 5, and the arrangement is such that a dichroic mirror 15, an interference filter 16, a relay lens 17' and a TV camera 17 are disposed below the rectangular slit 4 for setting the laser exposure ranges 32a–32d, and there is further provided a rectangular slit 60 for observation.

The distance between the observation slit 60 and the object lens 6 is made equal to the distance between the object lens 6 and the rectangular slit 4, and the width of the observation slit 60 can be set equal to that of the rectangular slit 4 by means of a drive mechanism 61 which operates in response to the signal from the control unit 26. The rectangular observation slit 60 is used to project the image within the laser exposure ranges 32a–32d to the monitor TV 18. However, this slit is not necessary when the dichromic mirror 15 has a characteristic of reflecting only the wavelength of the reference light beam in a certain proportion and the image obtained by the reference light beam is used for observation. In this case, the interference filter 16 is not necessary either. Other arrangement, operation and method of correction of the apparatus shown in FIG. 8 are the same as described with reference to FIGS. 1 and 5.

In FIGS. 1, 5 and 8, the laser beam is directed onto the pattern surface side, however, the same result is reached by directing the laser beam through the glass substrate 7. By selective use of the correcting material 19 which deposits a low-resistance metal by exposure using the laser beam, the present invention can be applied not only correction of transparent defects on the photomask, but also electrical interconnections between wires formed on the silicon wafer as seen in ICs and LSIs.

What is claimed is:

1. A method of correcting a transparent defect on a photomask comprising the steps of:
   (a) coating at least a transparent defect portion and its periphery on a photomask having a transparent defect portion with a film formed of a metal-organic solution;
   (b) altering a portion of the metal-organic complex solution film corresponding to said transparent defect portion to a opaque and insoluble material by exposing said portion of metal-organic complex solution film to a visible ray or an ultraviolet ray until the quantity of light transmitted through said portion of metal-organic complex solution film and measured by an optical detection means falls below a predetermined level relative to the quantity of light when the exposure has started; and
   (c) removing a non-altered portion of said metal-organic complex solution film from the photomask with a solvent and leaving the altered portion corresponding to the transparent defect portion.

2. A method of correcting a transparent defect on a photomask according to claim 1, wherein said metal-organic complex solution film is made from at least an organic solvent, silver complex and a metallic alcoholate.

3. A method of correcting a transparent defect on a photomask according to claim 2, wherein said silver complex is formed by a chemical reaction of at least silver nitrate and carboxylic acid.

4. A method of correcting a transparent defect on a photomask according to claim 2, wherein said metallic alcoholate is a titanium alcoholate.

5. A method of correcting a transparent defect on a photomask according to claim 2, wherein said organic solvent comprises a mixture of methyl Cellosolve and acetonitrile.

6. A method of correcting a transparent defect on a photomask according to claim 1, further comprising coating the corrected surface of the photomask with a silicon oxide.

7. A method of correcting a transparent defect on a photomask according to claim 1, wherein said metal-organic complex solution film is a cobalt-organic complex solution film or copper-organic complex solution film.

8. A method of correcting a transparent defect on a photomask according to claim 1, wherein the ray utilized to expose said portion of metal-organic complex solution film has a wavelength of at most 1.3 μm.

9. A method of correcting a transparent defect on a photomask according to claim 1, further comprising coating the corrected surface of the photomask with a transparent protective film.

10. A method of correcting a transparent defect on a photomask comprising the steps of:
(a) coating at least a transparent defect portion and its periphery on a photomask having a transparent defect portion with a film formed of a metal-organic complex solution;
(b) altering a portion of the metal-organic complex solution film corresponding to said transparent defect portion to an opaque, insoluble and high adhesive material by exposing said portion of metal-organic complex solution film to a visible ray or an ultraviolet ray until a certain duration is followed after the quantity of light transmitted through said portion of metal-organic complex solution film and measured by an optical detection means has fallen sharply down to a certain level; and
(c) removing a non-altered portion of said metal-organic complex solution film from the photomask with a solvent and leaving the altered portion corresponding to the transparent defect portion.

11. A method of correcting a transparent defect on a photomask according to claim 10, wherein said metal-organic complex solution film is made from an organic solvent, at least a silver complex and a metallic alcoholate.

12. A method of correcting a transparent defect on a photomask according to claim 11, wherein said silver complex is formed by a chemical reaction of at least silver nitrate and a carboxylic acid.

13. A method of correcting a transparent defect on a photomask according to claim 11, wherein said metallic alcoholate is a titanium alcoholate.

14. A method of correcting a transparent defect on a photomask according to claim 11, wherein said organic solvent comprises a mixture of methyl Cellosolve and acetonitrile.

15. A method of correcting a transparent defect on a photomask according to claim 10, further comprising coating the corrected surface of the photomask with a silicon oxide.

16. A method of correcting a transparent defect on a photomask comprising the steps of:
(a) coating at least a transparent defect portion and its periphery on a photomask having a transparent defect portion with a film formed of a metal-organic complex solution;
(b) altering a portion of the metal-organic complex solution corresponding to said transparent defect portion to an opaque and insoluble material by exposing said portion of metal-organic complex solution film to a visible ray or an ultraviolet ray until the difference of contrast reflected from said portion of metal-organic complex solution and detected by an optical detection means falls below a certain value; and
(c) removing a non-altered portion of said metal-organic complex solution with a solvent and leaving the altered portion corresponding to the transparent defect portion.

17. A method of correcting a transparent defect on a photomask according to claim 16, wherein said metal-organic complex solution film is made from an organic solvent, at least a silver complex and a metallic alcoholate.

18. A method of correcting a transparent defect on a photomask according to claim 17, wherein said silver complex is formed by a chemical reaction of at least silver nitrate and carboxylic acid.

19. A method of correcting a transparent defect on a photomask according to claim 17, wherein said metallic alcoholate is a titanium alcoholate.

20. A method of correcting a transparent defect on a photomask according to claim 17, wherein said organic solvent comprises a mixture of methyl Cellosolve and acetonitrile.

21. A method of correcting a transparent defect on a photomask according to claim 17, further comprising coating the corrected surface of the photomask with a silicon oxide.

22. An apparatus for correcting a transparent defect on a photomask comprising:
laser beam generating means for generating a laser beam;
a slit for forming the cross section of said laser beam generated by said laser beam generating means to have arbitrary dimensions;
object lens means for focusing said laser beam formed by said slit as a contracted image of said slit;
a table for carrying a photomask having a transparent defect portion to which a metal-organic complex solution film is to be applied;
a detector for detecting the difference of quantity of light transmitted through said transparent defect portion by altering said metal-organic complex solution film;
first control means for controlling the position of said table so that a projection image of said slit coincides with a portion of said transparent defect portion in accordance with information about the location of said transparent defect portion on the photomask; and
second control means for determining the completion of correction of said transparent defect portion obtained by altering said metal-organic complex solution film in accordance with a signal from said detector and for switching said laser beam ON and OFF.

23. An apparatus for correcting a transparent defect on a photomask according to claim 22, wherein said second control means includes means for determining the completion of correction of said transparent defect portion in such a way that said laser beam is directed to said transparent defect portion coated with the metal-organic complex solution film, said detector detects a signal representing the quantity of light transmitted through said transparent portion, a signal detected immediately after the laser exposure has started is compared with a signal detected successively, and the completion of correction is determined by detecting that said latter signal falls below a certain level relative to said former signal.

24. An apparatus for correcting a transparent defect on a photomask according to claim 22, wherein said second control means includes means for determining the completion of correction of said transparent defect portion in such a way that said laser beam is directed to said transparent defect portion, said detector detects a signal representing the quantity of transmitted light, the quantity of transmitted light detected at a certain time interval is compared with the previously detected quantity of transmitted light, and the completion of correction is determined following a certain elapse time after the quantity of transmitted light does not decrease any longer.

25. An apparatus for correcting a transparent defect on a photomask according to claim 22, wherein said table is an X/Y table capable of moving in the X and Y directions for positioning said photomask having a transparent defect portion relative to said laser beam.

26. An apparatus for correcting a transparent defect on a photomask according to claim 22, further comprising illumination means for observing and positioning the pattern of the photomask, including transparent defects thereof, and for observing said projection image of said slit, with said first control means controlling the positioning of said table, responsive to the observing of the pattern of the photomask and observing of the projection image of the slit, so that the projection image of the slit coincides with said position of said transparent defect.

27. An apparatus for correcting a transparent defect on a photomask according to claim 22, wherein said detector includes means for detecting decrease of light transmitted through said transparent defect portion by the altering of said metal-organic complex solution film.

28. An apparatus for correcting a transparent defect on a photomask according to claim 22, wherein said laser beam generating means and object lens means are positioned such that the laser beam is passed to said metal-organic complex solution film without passing through said photomask.

29. A method of correcting a transparent defect on a photomask according to claim 9, wherein the transparent protective film is made of a material selected from the group consisting of silicon oxide, indium oxide, tin oxide and titanium oxide.

30. A method of correcting a transparent defect on a photomask according to claim 1, wherein the metal-organic complex solution film has a thickness of 0.1–1 $\mu$m.

31. A method of correcting a transparent defect on a photomask according to claim 10, wherein the metal-organic complex solution film has a thickness of 0.1–1 $\mu$m.

32. A method of correcting a transparent defect on a photomask according to claim 16, wherein the metal-organic complex solution film has a thickness of 0.1–1 $\mu$m.

33. A method of correcting a transparent defect on a photomask according to claim 10, wherein said metal-organic complex solution film is a cobalt-organic complex solution film or copper-organic complex solution film.

34. A method of correcting a transparent defect on a photomask according to claim 33, wherein said cobalt-organic complex solution film includes a reaction product of cobalt nitrate and carboxylic acid, and said copper-organic complex solution film includes a reaction product of copper nitrate and carboxylic acid.

35. A method of correcting a transparent defect on a photomask according to claim 16, wherein said metal-organic complex solution film is a cobalt-organic complex solution film or copper-organic complex solution film.

36. A method of correcting a transparent defect on a photomask according to claim 35, wherein said cobalt-organic complex solution film includes a reaction product of cobalt nitrate and carboxylic acid, and said copper-organic complex solution film includes a reaction product of copper nitrate and carboxylic acid.

37. A method of correcting a transparent defect on a photomask according to claim 7, wherein said cobalt-organic complex solution film includes a reaction product of cobalt nitrate and carboxylic acid, and said copper-organic complex solution film includes a reaction product of copper nitrate and carboxylic acid.

38. A method of correcting a transparent defect on a photomask according to claim 1, wherein the portion of metal-organic complex solution film is exposed to a visible ray or an ultraviolet ray from a laser.

39. A method of correcting a transparent defect on a photomask according to claim 10, wherein the portion of metal-organic complex solution film is exposed to a visible ray or an ultraviolet ray from a laser.

40. A method of correcting a transparent defect on a photomask according to claim 16, wherein the portion of metal-organic complex solution film is exposed to a visible ray or an ultraviolet ray from a laser.

* * * * *